United States Patent
Chang

(10) Patent No.: US 7,233,502 B1
(45) Date of Patent: Jun. 19, 2007

(54) TWIN-SUBSTRATE WIRELESS ELECTRONIC MODULE AND METHOD FOR MAKING THE SAME

(75) Inventor: Cho-Hsing Chang, Chang-Hua Hsien (TW)

(73) Assignee: Universal Scientific Industrial Co., Ltd., Nan-Tou Hsien (TW)

( * ) Notice: Subject to any disclaimer, the term of this patent is extended or adjusted under 35 U.S.C. 154(b) by 0 days.

(21) Appl. No.: 11/375,046

(22) Filed: Mar. 15, 2006

(51) Int. Cl.
*H05K 7/14* (2006.01)

(52) U.S. Cl. .................. 361/800; 361/752; 361/767; 361/749; 361/600

(58) Field of Classification Search .............. 361/600, 361/679, 728, 735, 736, 742, 747, 748, 749, 361/752, 760, 784, 800; 174/706
See application file for complete search history.

(56) References Cited

U.S. PATENT DOCUMENTS 5,481,436 A * 1/1996 Werther ................ 361/784
5,747,875 A * 5/1998 Oshima ................ 257/687

* cited by examiner

*Primary Examiner*—Thao X. Le
*Assistant Examiner*—Sheldon Soon
(74) *Attorney, Agent, or Firm*—Pillsbury Winthrop Shaw Pittman, LLP

(57) ABSTRACT

A twin-substrate wireless electronic module includes a main substrate, a plurality of integrated circuit chips, a frame substrate, a filter, and a shield member. The main substrate has a first surface and a second surface, and is formed with a notch that extends from the first surface through the second surface. The integrated circuit chips are surface-mounted on the first and second surfaces of the main substrate. One of the integrated circuit chips disposed on the first surface is a transceiver integrated circuit chip. The frame substrate has a first frame surface and a second frame surface. The first frame surface has a filter-mounting area aligned with the notch. The filter is surface-mounted on the filter-mounting area and is accommodated in the notch. A method for manufacturing the twin-substrate wireless electronic module is also disclosed.

13 Claims, 5 Drawing Sheets

TWIN-SUBSTRATE WIRELESS ELECTRONIC MODULE AND METHOD FOR MAKING THE SAME

BACKGROUND OF THE INVENTION

1. Field of the Invention

The invention relates to an electronic module, more particularly to a twin-substrate wireless electronic module suitable for application to wireless transmission devices and to a method for manufacturing the same.

2. Description of the Related Art

In commonly assigned co-pending U.S. patent application Ser. No. 11/111,938, there is disclosed a miniaturized multi-chip module suitable for application to wireless transmission devices. The multi-chip module includes a substrate, integrated circuit chips mounted on and connected electrically to the substrate, and an interposer mounted on one surface of the substrate. The interposer cooperates with the substrate to confine a receiving space for receiving the integrated circuit chips on the surface of, the substrate to which the interposer is attached, and is provided with conductors that are connected electrically to the substrate. Therefore, when the interposer is mounted on a circuit board, the conductors serve as external electrical connections for the integrated circuit chips. A method for manufacturing the miniaturized multi-chip module is also disclosed therein.

SUMMARY OF THE INVENTION

An object of the present invention is to provide a twin-substrate wireless electronic module which is suitable for application to wireless transmission devices and which does not use solder balls for making internal electrical connections.

Another object of the present invention is to provide a method for manufacturing the twin-substrate wireless electronic module.

According to one aspect of the invention, there is provided a twin-substrate wireless electronic module which includes a main substrate, a plurality of integrated circuit chips, a frame substrate, a filter, and a shield member.

The main substrate has a first surface, a second surface opposite to the first surface, a plurality of first solder pad units formed on the first and second surfaces, and a conductor unit formed on the second surface and connected electrically to the first solder pad units. The main substrate is formed with a notch that extends from the first surface through the second surface.

The integrated circuit chips are surface-mounted on the first and second surfaces of the main substrate at the first solder pad units. One of the integrated circuit chips that is disposed on the first surface of the main substrate is a transceiver integrated circuit chip.

The frame substrate has a first frame surface, a second frame surface opposite to the first frame surface, a surrounding frame surface interconnecting the first and second frame surfaces, and a second solder pad unit provided on the first frame surface.

The first frame surface is surface-mounted on the second surface of the main substrate such that the conductor unit is connected electrically to the second solder pad unit, and such that the surrounding frame surface cooperates with the second surface of the main substrate to form a receiving space that receives the integrated circuit chips on the second surface of the main substrate therein.

The first frame surface further has a filter-mounting area aligned with the notch in the main substrate and provided with a filter pad unit that is connected electrically to the second solder pad unit.

The filter is surface-mounted on the filter-mounting area of the first frame surface at the filter pad unit and is accommodated in the notch of the main substrate.

The shield member is mounted on the first surface of the main substrate for shielding the transceiver integrated circuit chip and the filter.

According to another aspect of the invention, a method for manufacturing a twin-substrate wireless electronic module comprises the steps of:

a) forming a main substrate that has a first surface, a second surface opposite to the first surface, a plurality of first solder pad units formed on the first and second surfaces, and a conductor unit formed on the second surface and connected electrically to the first solder pad units;

b) surface-mounting at least one integrated circuit chip on the second surface of the main substrate at the first solder pad units on the second surface of the main substrate;

c) forming a frame substrate that has a first frame surface, a second frame surface opposite to the first frame surface, a surrounding frame surface interconnecting the first and second frame surfaces, and a second solder pad unit provided on the first frame surface;

d) surface-mounting the first frame surface of the frame substrate on the second surface of the main substrate such that the conductor unit is connected electrically to the second solder pad unit, and such that the surrounding frame surface cooperates with the second surface of the main substrate to form a receiving space that receives said at least one integrated circuit chip on the second surface of the main substrate therein;

e) surface-mounting a transceiver integrated circuit chip on the first surface of the main substrate at the first solder pad units on the first surface of the main substrate; and f) mounting a shield member on the first surface of the main substrate for shielding the transceiver integrated circuit chip.

BRIEF DESCRIPTION OF THE DRAWINGS

Other features and advantages of the present invention will become apparent in the following detailed description of the preferred embodiments with reference to the accompanying drawings, of which:

FIGS. 5-1 and 5-2 illustrate consecutive steps of the preferred embodiment of a method for manufacturing a twin-substrate wireless electronic module according to this invention.

DETAILED DESCRIPTION OF THE PREFERRED EMBODIMENTS

Figure 1:
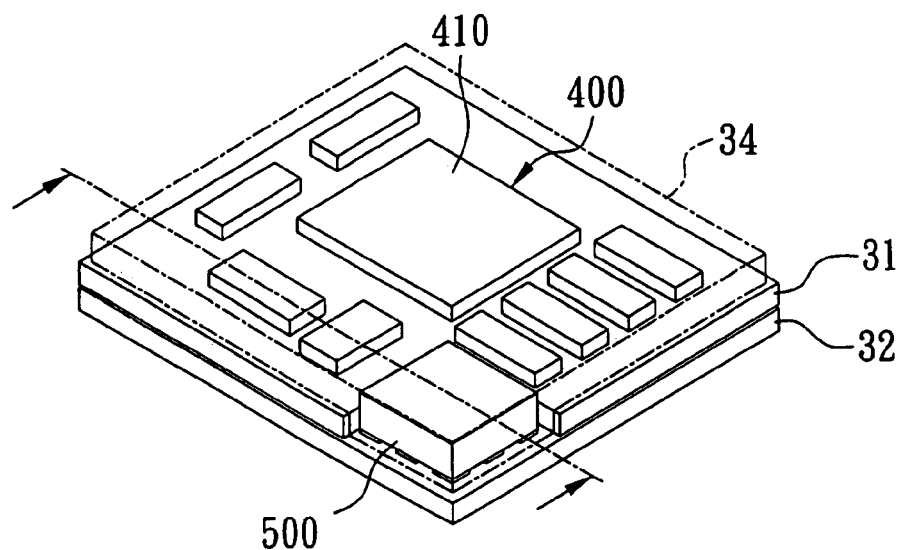
FIG. 1 is a perspective view of the preferred embodiment of a twin-substrate wireless electronic module according to the present invention.

Referring to FIGS. 1 to 4, the preferred embodiment of a twin-substrate wireless electronic module according to this invention includes a main substrate 31, a plurality of integrated circuit chips 400, a frame substrate 32, a filter 500, and a shield member 34.

The main substrate 31 has a first surface 311, a second surface 312 opposite to the first surface 311, a plurality of first solder pad units 100 formed on the first and second surfaces 311, 312 and made from solder paste, and a conductor unit 110 formed on the second surface 312 and connected electrically to the first solder pad units 100. The main substrate 31 has a corner formed with a notch 313 that extends from the first surface 311 through the second surface 312.

The integrated circuit chips 400 are surface-mounted on the first and second surfaces 311, 312 of the main substrate 31 at the first solder pad units 100. One of the integrated circuit chips 400 that is disposed on the first surface 311 of the main substrate 31 is a transceiver integrated circuit chip 410. The remaining ones of the integrated circuit chips 400 on the first surface 311 of the main substrate 31 include a resistor/capacitor chip, a balun, a switch, and any other suitable integrated circuit chip. The integrated circuit chips 400 on the second surface 312 of the main substrate 31 include a resistor/capacitor chip, an EEPROM chip, a flip-chip, and any other suitable integrated circuit chip.

The frame substrate 32 has a first frame surface 321, a second frame surface 322 opposite to the first frame surface 321, a surrounding frame surface 323 interconnecting the first and second frame surfaces 321, 322, and a second solder pad unit 120 provided on the first frame surface 321 and made from solder paste. The first frame surface 321 is surface-mounted on the second surface 312 of the main substrate 31 such that the conductor unit 110 is connected electrically to the second solder pad unit 120, and such that the surrounding frame surface 323 cooperates with the second surface 312 of the main substrate 31 to form a receiving space 324 that receives the integrated circuit chips 400 on the second surface 312 of the main substrate 31 therein. The integrated circuit chips 400 on the second surface 312 of the main substrate 31 have a largest height measured from the second surface 312 of the main substrate 31. The frame substrate 32 has a thickness not less than the largest height. The frame substrate 32 is in the form of a loop, and the surrounding frame surface 323 surrounds the receiving space 324. The first frame surface 321 further has a filter-mounting area 325 aligned with the notch 313 in the main substrate 31 and provided with a filter pad unit 130 that is connected electrically to the second solder pad unit 120.

The filter 500 is surface-mounted on the filter-mounting area 325 of the first frame surface 321 at the filter pad unit 130 and is accommodated in the notch 313 of the main substrate 31.

The shield member 34 is mounted on the first surface 311 of the main substrate 31 for shielding the integrated circuit chips 400 including the transceiver integrated circuit chip 410 on the first surface 311 of the main substrate 31, as well as the filter 500. The shield member 34 includes a protruding segment 341 extending through the notch 313 of the main substrate 31 toward the first frame surface 321 of the frame substrate 32 such that the filter-mounting area 325 is shielded by the protruding segment 341 of the shield member 34.

Figure 2:
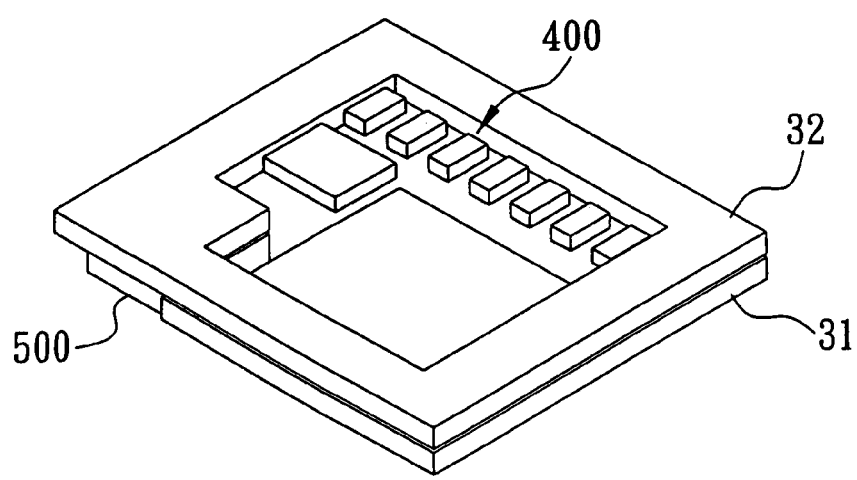
FIG. 2 is another perspective view of the preferred embodiment.
Figure 3:
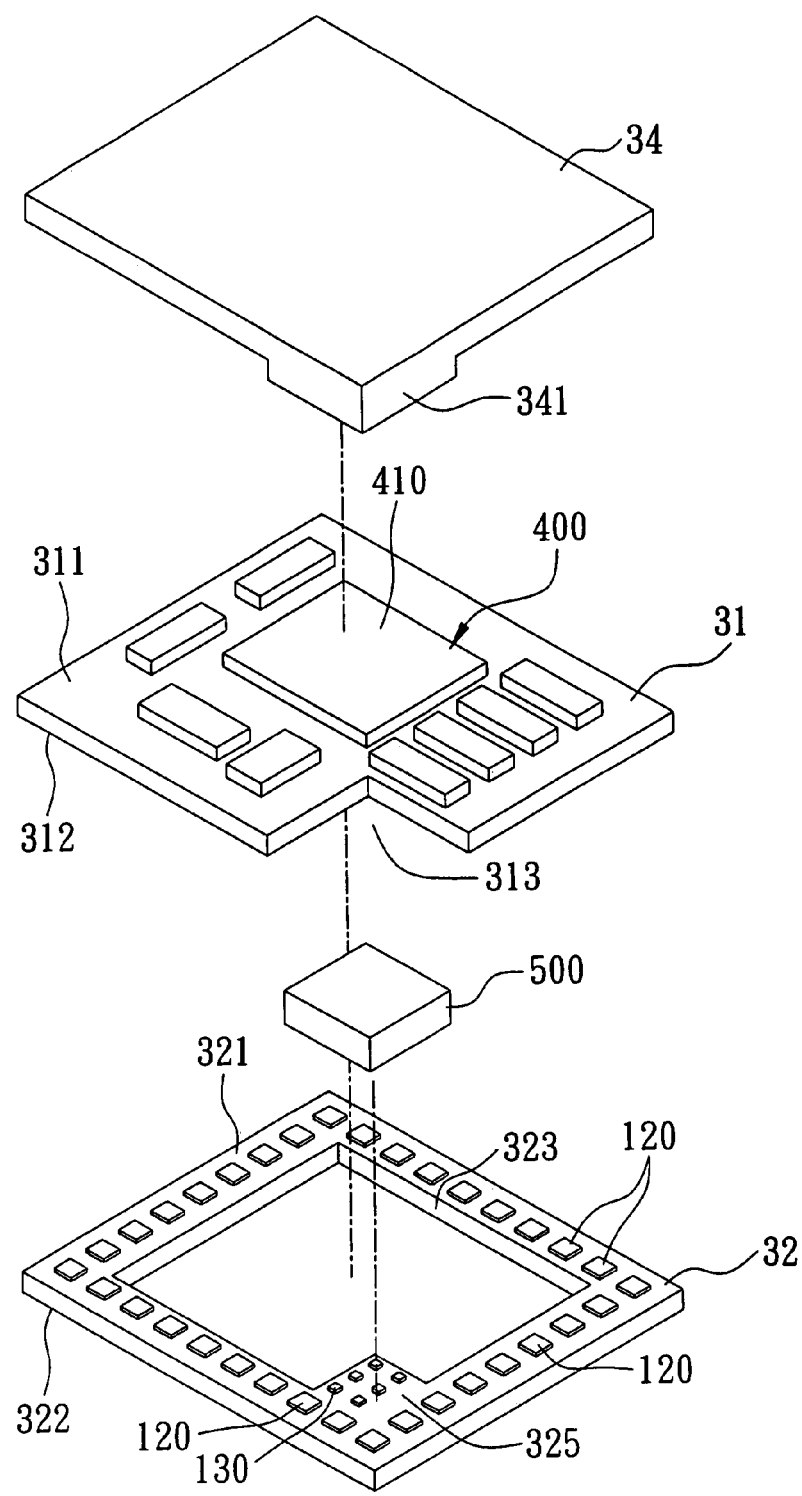
FIG. 3 is an exploded perspective view of the preferred embodiment.
Figure 4:
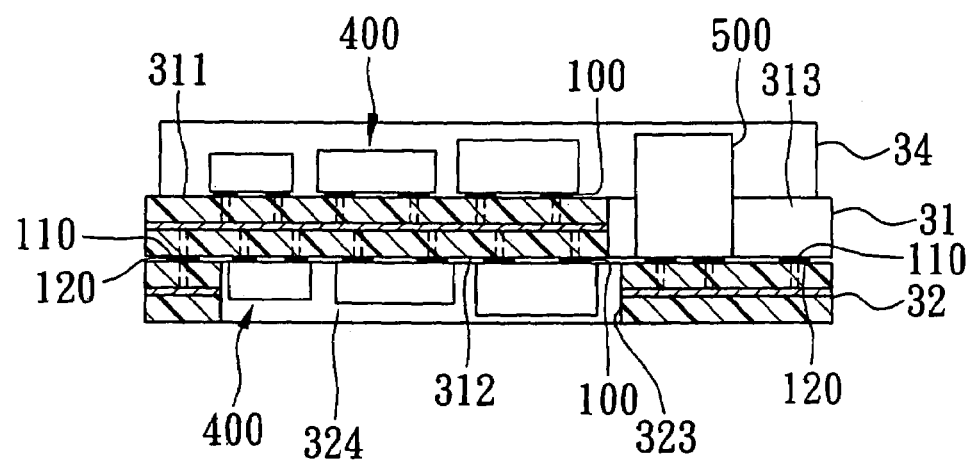
FIG. 4 is a sectional view of the preferred embodiment.
Figures 1, 5:
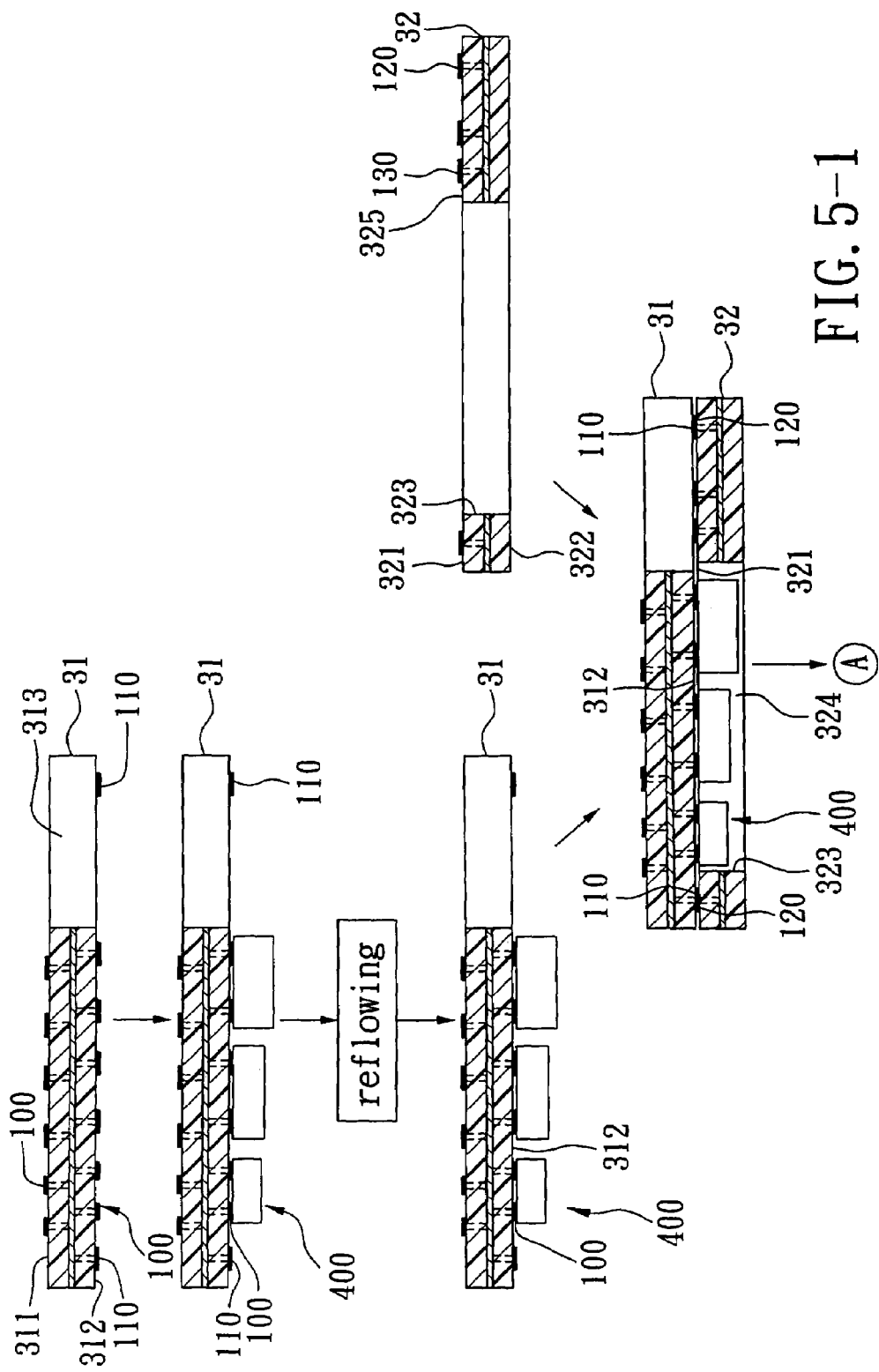
Figures 2, 5:
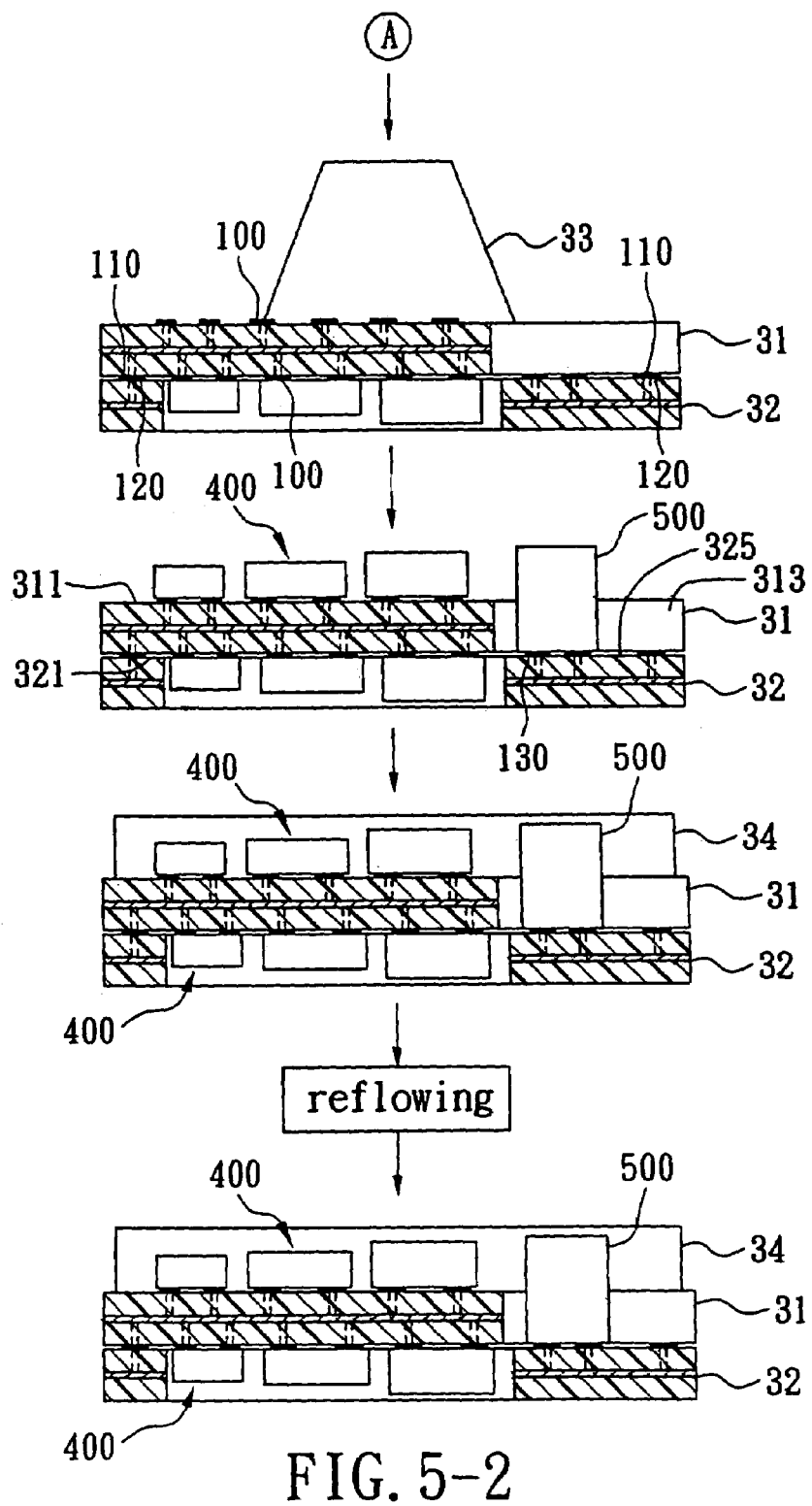

FIGS. 5-1 and 5-2 illustrate consecutive steps of a method for manufacturing the twin-substrate wireless electronic module of the preferred embodiment. The method comprises the following steps:

a) The main substrate 31 is formed to have the first surface 311, the second surface 312 opposite to the first surface 311, a plurality of the first solder pad units 100 formed on the first and second surfaces 311, 312, and the conductor unit 110 formed on the second surface 110 and connected electrically to the first solder pad units 100. The main substrate 31 is formed with a notch 313 that extends from the first surface 311 through the second surface 312.

b) A plurality of the integrated circuit chips 400, which include resistor/capacitor chips, an EEPROM chip, a flip-chip, and any other suitable integrated circuit chips, are surface-mounted on the second surface 312 of the main substrate 31 at the first solder pad units 100 on the second surface 312 of the main substrate 31 through conventional soldering techniques, such as reflowing.

c) The frame substrate 32 is formed to have the first frame surface 321, the second frame surface 322 opposite to the first frame surface 321, the surrounding frame surface 323 interconnecting the first and second frame surfaces 321, 322, and the second solder pad unit 120 provided on the first frame surface 321. The first frame surface 321 has the filter-mounting area 325 to be aligned with the notch 313 in the main substrate 31 and provided with the filter pad unit 130 that is connected electrically to the second solder pad unit 120.

d) The first frame surface 321 of the frame substrate 32 is surface-mounted on the second surface 312 of the main substrate 31 such that the conductor unit 110 is connected electrically to the second solder pad unit 120, and such that the surrounding frame surface 323 cooperates with the second surface 312 of the main substrate 31 to form a receiving space 324 that receives the integrated circuit chips 400 on the second surface 312 of the main substrate 31 therein. The frame substrate 32 is formed into a loop such that the surrounding frame surface 323 surrounds the receiving space 324. In this step, the first frame surface 321 of the frame substrate 32 and the second surface 312 of the main substrate 31 are pressed toward each other using a compressing member 33 such that the thickness of the second solder pad unit 120 is reduced.

e) The transceiver integrated circuit chip (see FIG. 3) is surface-mounted on the first surface 311 of the main substrate 31 at the first solder pad units 100 on the first surface 311 of the main substrate 31, and the filter 500 is surface-mounted on the filter-mounting area 325 of the first frame surface 321 of the frame substrate 32 at the filter pad unit 130 such that the filter 500 is accommodated in the notch 313 of the main substrate 31. The other integrated circuit chips 400, such as resistor/capacitor chips, a balun, and a switch, are also surface-mounted on the first surface 311 of the main substrate 31 at the first solder pad units 100 on the first surface 311 of the main substrate 31 in this step.

f) Finally, the shield member 43 is mounted on the first surface 311 of the main substrate 31 for shielding the integrated circuit chips 400 including the transceiver integrated circuit chip 410 on the first surface 311 of the main substrate 31, as well as the filter 500. A semi-product is obtained thereby, which is then processed by reflowing so as to obtain the twin-substrate wireless electronic module of this invention.

In view of the aforesaid, since conventional solder balls are not used in the present invention, and since compressive forces are used in the method for making the twin-substrate wireless electronic module of this invention, the overall thickness of the twin-substrate wireless electronic module is reduced. Furthermore, the number of the reflowing operation used in the method of this invention is relatively small.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A twin-substrate wireless electronic module comprising:
   a main substrate having a first surface, a second surface opposite to said first surface, a plurality of first solder pad units formed on said first and second surfaces, and a conductor unit formed on said second surface and connected electrically to said first solder pad units, said main substrate being formed with a notch that extends from said first surface through said second surface;
   a plurality of integrated circuit chips surface-mounted on said first and second surfaces of said main substrate at said first solder pad units, one of said integrated circuit chips that is disposed on said first surface of said main substrate being a transceiver integrated circuit chip;
   a frame substrate having a first frame surface, a second frame surface opposite to said first frame surface, a surrounding frame surface interconnecting said first and second frame surfaces, and a second solder pad unit provided on said first frame surface,
   said first frame surface being surface-mounted on said second surface of said main substrate such that said conductor unit is connected electrically to said second solder pad unit, and such that said surrounding frame surface cooperates with said second surface of said main substrate to form a receiving space that receives said integrated circuit chips on said second surface of said main substrate therein,
   said first frame surface further having a filter-mounting area aligned with said notch in said main substrate and provided with a filter pad unit that is connected electrically to said second solder pad unit;
   a filter surface-mounted on said filter-mounting area of said first frame surface at said filter pad unit and accommodated in said notch of said main substrate; and
   a shield member mounted on said first surface of said main substrate for shielding said transceiver integrated circuit chip and said filter.

2. The twin-substrate wireless electronic module as claimed in claim 1, wherein said frame substrate is in the form of a loop, and said surrounding frame surface surrounds said receiving space.

3. The twin-substrate wireless electronic module as claimed in claim 1, wherein each of remaining ones of said integrated circuit chips on said first surface of said main substrate is selected from the group consisting of a resistor/capacitor chip, a balun, and a switch.

4. The twin-substrate wireless electronic module as claimed in claim 1, wherein each of said integrated circuit chips on said second surface of said main substrate is selected from the group consisting of a resistor/capacitor chip, an EEPROM chip, and a flip-chip.

5. The twin-substrate wireless electronic module as claimed in claim 1, wherein said integrated circuit chips on said second surface of said main substrate have a largest height measured from said second surface of said main substrate, said frame substrate having a thickness not less than said largest height.

6. The twin-substrate wireless electronic module as claimed in claim 1, wherein said shield member includes a protruding segment extending through said notch of said main substrate toward said first frame surface of said frame substrate such that said filter-mounting area is shielded by said protruding segment of said shield member.

7. A method for manufacturing a twin-substrate wireless electronic module, comprising:
   a) forming a main substrate that has a first surface, a second surface opposite to the first surface, a plurality of first solder pad units formed on the first and second surfaces, and a conductor unit formed on the second surface and connected electrically to the first solder pad units;
   b) surface-mounting at least one integrated circuit chip on the second surface of the main substrate at the first solder pad units on the second surface of the main substrate;
   c) forming a frame substrate that has a first frame surface, a second frame surface opposite to the first frame surface, a surrounding frame surface interconnecting the first and second frame surfaces, and a second solder pad unit provided on the first frame surface;
   d) surface-mounting the first frame surface of the frame substrate on the second surface of the main substrate such that the conductor unit is connected electrically to the second solder pad unit, and such that the surrounding frame surface cooperates with the second surface of the main substrate to form a receiving space that receives said at least one integrated circuit chip on the second surface of the main substrate therein;
   e) surface-mounting a transceiver integrated circuit chip on the first surface of the main substrate at the first solder pad units on the first surface of the main substrate; and
   f) mounting a shield member on the first surface of the main substrate for shielding the transceiver integrated circuit chip.

8. The method as claimed in claim 7, wherein the main substrate is formed with a notch that extends from the first surface through the second surface, the first frame surface having a filter-mounting area to be aligned with the notch in the main substrate and provided with a filter pad unit that is connected electrically to the second solder pad unit, the step e) further including surface-mounting a filter on the filter-mounting area of the first frame surface of the frame substrate at the filter pad unit such that the filter is accommodated in the notch of the main substrate, the filter being shielded by the shield member in the step f).

9. The method as claimed in claim 7, wherein, in step d), the frame substrate and the main substrate are pressed toward each other to reduce the thickness of the second solder pad unit.

10. The method as claimed in claim 7, wherein, in step c), the frame substrate is formed into a loop such that the surrounding frame surface surrounds the receiving space in step d).

11. The method as claimed in claim 7, wherein, in step b), said at least one integrated circuit chip on the second surface of the main substrate is selected from the group consisting of a resistor/capacitor chip, an EEPROM chip, and a flip-chip.

12. The method as claimed in claim 7, wherein step e) further includes surface-mounting at least one other integrated circuit chip on the first surface of the main substrate at the first solder pad units on the first surface of the main substrate, said at least one other integrated circuit chip on the first surface of the main substrate being selected from the group consisting of a resistor/capacitor chip, a balun, and a switch.

13. The method as claimed in claim 7, wherein said at least one integrated circuit chip on the second surface of the main substrate has a largest height measured from the second surface of the main substrate, the frame substrate having a thickness not less than the largest height.

* * * * *